(12) United States Patent
Han

(10) Patent No.: US 6,441,497 B1
(45) Date of Patent: Aug. 27, 2002

(54) SEMICONDUCTOR DEVICE FABRICATED ON MULTIPLE SUBSTRATES AND METHOD FOR FABRICATING THE SAME

(75) Inventor: Il-Seok Han, Ichon-shi (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 09/977,249

(22) Filed: Oct. 16, 2001

(30) Foreign Application Priority Data

Mar. 30, 2001 (KR) .......................................... 2001-16945

(51) Int. Cl.[7] .......................... H01L 23/48; H01L 23/52; H01L 29/40
(52) U.S. Cl. ........................................ 257/777; 257/778
(58) Field of Search ................................. 438/461, 462, 438/975, 612; 257/777, 778, 779, 780, 797

(56) References Cited

U.S. PATENT DOCUMENTS

| | | | |
|---|---|---|---|
| 4,749,442 A | | 6/1988 | Barbu et al. |
| 5,523,628 A | * | 6/1996 | Williams et al. ............. 257/777 |
| 5,672,542 A | * | 9/1997 | Schwiebert et al. ........... 438/4 |
| 5,798,565 A | * | 8/1998 | Atkins et al. ................ 257/668 |
| 5,801,719 A | | 9/1998 | Jabbi et al. |
| 6,002,136 A | | 12/1999 | Naeem |
| 6,005,292 A | * | 12/1999 | Roldan et al. ............... 257/690 |
| 6,221,691 B1 | * | 4/2001 | Schrock ....................... 257/779 |
| 6,281,452 B1 | * | 8/2001 | Prasad et al. ................. 174/262 |
| 6,297,141 B1 | * | 10/2001 | Miyazaki ..................... 257/773 |
| 6,297,560 B1 | * | 10/2001 | Capote et al. ............... 257/778 |

* cited by examiner

Primary Examiner—Olik Chaudhuri
Assistant Examiner—Hoai Pham
(74) Attorney, Agent, or Firm—Jacobson Holman, PLLC

(57) ABSTRACT

A semiconductor device fabricated on a multiple substrate with a first structure including a first semiconductor substrate with at least one first bonding pad and at least one alignment key formed thereon, and a second structure including a second semiconductor substrate with at least one second bonding pad and at least one alignment aperture passing through the second semiconductor substrate. By irradiating a UV beam through the alignment aperture and detecting reflection off the alignment key, the first and second semiconductor substrates are aligned.

7 Claims, 9 Drawing Sheets

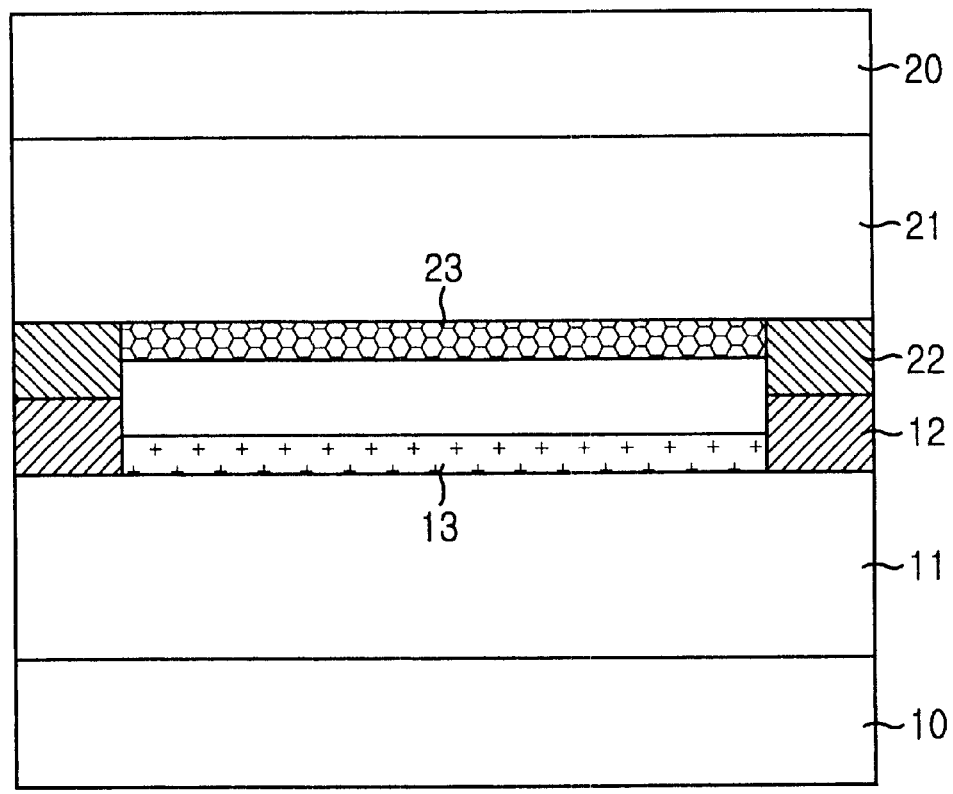

SEMICONDUCTOR DEVICE FABRICATED ON MULTIPLE SUBSTRATES AND METHOD FOR FABRICATING THE SAME

FIELD OF THE INVENTION

The present invention relates to a semiconductor device and, more particularly, to a semiconductor device fabricated on a multiple substrate and a method for fabricating the same.

DESCRIPTION OF THE PRIOR ART

A merged memory and logic (MML) device is as an example of a semiconductor device formed on a multiple substrate. The merged memory and logic device has a memory device, such as DRAM (Dynamic Random Access Memory), SRAM (Static Random Access Memory) or the like, and a logic device, which are formed on the multiple substrate in order to achieve a system marked by lightness, thinness, shortness, smallness, high efficiency and low-power consumption.

FIGS. 1A to 1C are cross-sectional views showing fabrication processes of a merged memory and logic device according to the prior art.

As shown in FIG. 1A, an interlayer insulating layer 11 is formed on a memory device (not shown) and a first semiconductor substrate 10. A final metal wire is formed on the interlayer insulating layer 11 and then bonding pads 12 are formed in order to join a second semiconductor substrate to the first semiconductor substrate 10. A protection layer 13 is formed on the bonding pads 12 and the interlayer insulating layer 11 and then the bonding pads 12 are exposed by selectively etching back the protection layer 13. Typically, different elements, such as gate electrodes of transistors, bit lines, metal wires, contact holes and via holes, are formed on the first semiconductor substrate 10 and metal lines and polysilicon layers are used to implement these structures.

On the other hand, referring to FIG. 1B, an interlayer insulating layer 21 is formed on a logic device (not shown) which is formed on a second semiconductor substrate 20. A final metal wire is formed on the interlayer insulating layer 21 and bonding pads 22 are formed on the interlayer insulating layer 21 in order to join the second semiconductor substrate 20 to the first semiconductor substrate 10. A protection layer 23 is formed on the bonding pads 22 and the interlayer insulating layer 21 and then the bonding pads 22 are exposed by selectively etching back the protection layer 23.

The interlayer insulating layer 21 is formed on logic transistors made by polysilicon layers, multi-step metal wires and contact and via holes for metal interconnection.

As shown in FIG. 1C, in order to connect each memory device and logic device formed on the first semiconductor substrate 10 and the second semiconductor substrate 20, respectively, the second semiconductor is turned upside down so as to join the bonding pads 12 of the first semiconductor substrate 10 to the bonding pads 22 of the second semiconductor substrate 20 and the first and second semiconductors 10, 20 are stacked. When the stacked first and second semiconductor substrates 10, 20 are annealed at a temperature of 300° C. to 450° C., the bonding pads 12 of the first semiconductor 10 and the bonding pads 22 of the second semiconductor 20 are electrically connected.

Since a conventional stacking technique for a merged memory and logic device, as mentioned above, does not use a mask align key for joining the first and second semiconductor substrates 10 and 20, a misalignment is caused, making it difficult to electrically connect the first semiconductor substrate 10 and the second semiconductor substrate 20.

SUMMARY OF THE INVENTION

It is, therefore, an object of the present invention to provide a semiconductor device fabricated on multiple substrates and a method for fabricating the same.

In accordance with a first aspect of the present invention, there is provided a semiconductor device, comprising: 1) a first structure including a first semiconductor substrate, at least one first bonding pad, and at least one alignment key formed on the first semiconductor substrate; and 2) a second structure including a second semiconductor substrate, at least one second bonding pad, and at least one alignment aperture passing through the second semiconductor substrate.

In accordance with another aspect of the present invention, there is provided a semiconductor device comprising: 1) a first structure including a first semiconductor substrate having a first circuit device, a first interlayer insulating layer formed on the first semiconductor substrate, at least one first bonding pad formed on the first interlayer insulating layer, and at least one alignment key formed on the first interlayer insulating layer; and 2) a second structure including a second semiconductor substrate having a second circuit device, a second interlayer insulating layer formed on the second semiconductor substrate, at least one second bonding pad formed on the second interlayer insulating layer, and at least one beam guiding aperture passing through the second structure and providing a beam path to the alignment key on the first interlayer insulating layer.

In accordance with a further aspect of the present invention, there is provided a method for fabricating a semiconductor device, comprising steps of providing a first semiconductor substrate having a first circuit device; forming a first interlayer insulating layer on the first semiconductor substrate; forming at least one bonding pad on the first interlayer insulating layer; forming at least one alignment key on the first interlayer insulating layer; providing a second semiconductor substrate having a second circuit device; forming a second interlayer insulating layer on the second semiconductor substrate; forming at least one second bonding pad on the second interlayer insulating layer; forming at least one alignment aperture by selectively etching the second interlayer insulating layer and the second semiconductor substrate; aligning the first semiconductor substrate and the second semiconductor substrate for joining the first bonding pad with the second bonding pad; irradiating a beam passing through the alignment aperture and detecting a beam reflectivity; re-aligning the first semiconductor substrate until the beam reflectivity is matched with a reflectivity of the alignment key; and joining the first bonding pad with the second bonding pad by a thermal treatment process.

BRIEF DESCRIPTION OF THE DRAWINGS

The above and other objects and features of the present invention will become apparent from the following description of the preferred embodiments given in conjunction with the accompanying drawings, in which:

FIGS. 1A to 1C are cross-sectional views showing fabrication processes of a merged memory and logic device according to the prior art;

DETAILED DESCRIPTION OF THE PREFERRED EMBODIMENTS

Hereinafter, a semiconductor device fabricated on a multiple substrate and a method for fabricating the same according to the present invention will be described in detail referring to the accompanying drawings.

Figure 1A:
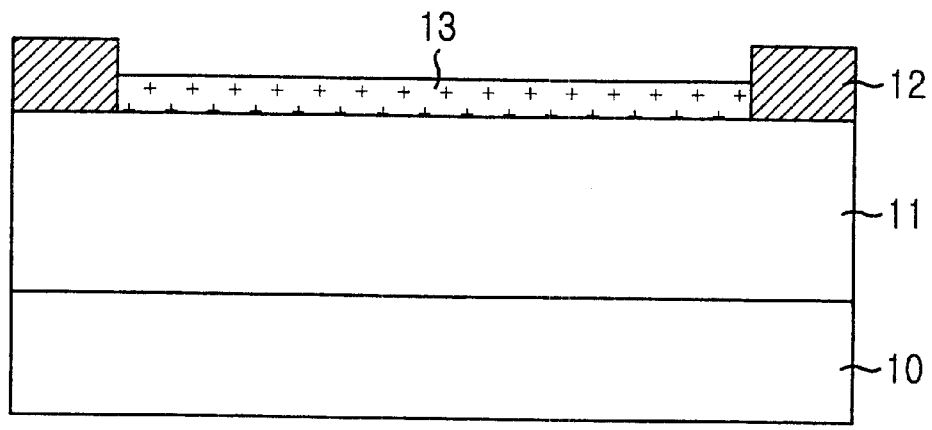
Figure 1B:
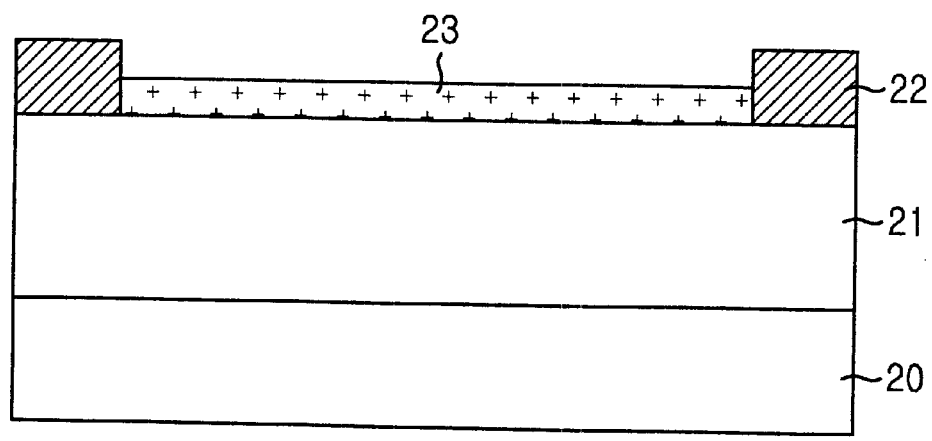
Figure 2A:
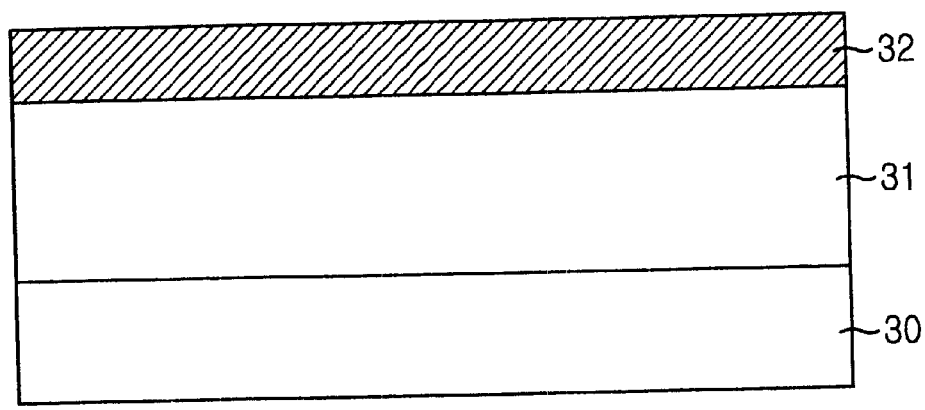
FIGS. 2A to 2B are cross-sectional views showing fabrication processes of a first semiconductor substrate of a merged memory and logic device according to the present invention.

As shown in FIG. 2A, an interlayer insulating layer 31 is formed on a first semiconductor substrate 30 on which a memory device (not shown) is provided, and a metal layer 32 is formed on the interlayer insulating layer 31 in order to form final metal wiring (not shown). The interlayer insulating layer 31 is formed on multiple metal wires, and a memory device including multiple polysilicon layers and a plurality of contact holes for electrically connecting source/drain regions of the memory to the multiple metal wires and via holes for connecting a metal wire to another metal wire are formed.

Figure 2B:
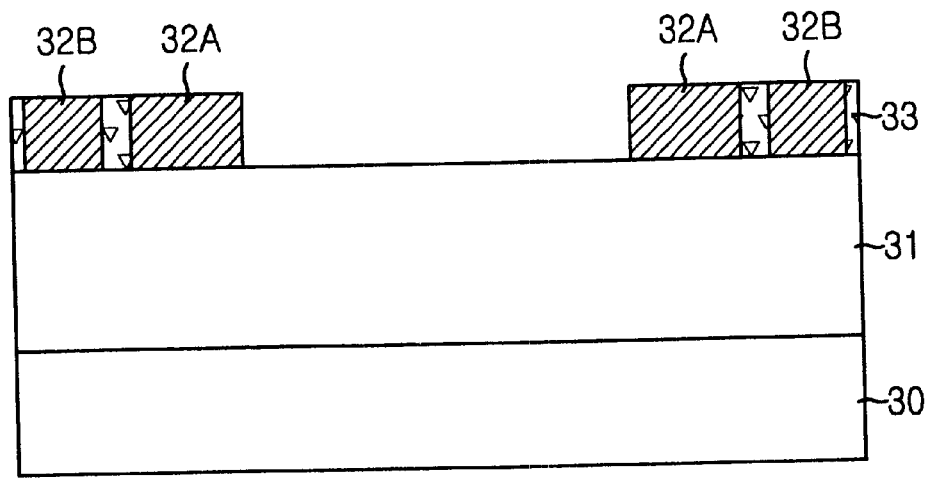

The metal layer 32 is selectively etched back and the final metal wire (not shown), such as an aluminum layer, is formed. Bonding pads 32A are formed in order to join a second semiconductor substrate and alignment keys 32B are formed at the same time, as shown in FIG. 2B. Misalignment detecting layer 33, which surround the alignment keys 32B, may also be formed. Their detailed layout will be described in reference to FIG. 3A. The misalignment detecting layers 33 can be formed with various materials having different reflectivity and an insulating layer, such as an oxide layer, is used as the misalignment detecting layer 33 in an embodiment of the present invention.

In another embodiment of the present invention, the interlayer insulating layer 31 itself can be used as a misalignment detecting layer without forming additional misalignment detecting layers, such as oxide layers, on the interlayer insulating layer.

Figure 3A:
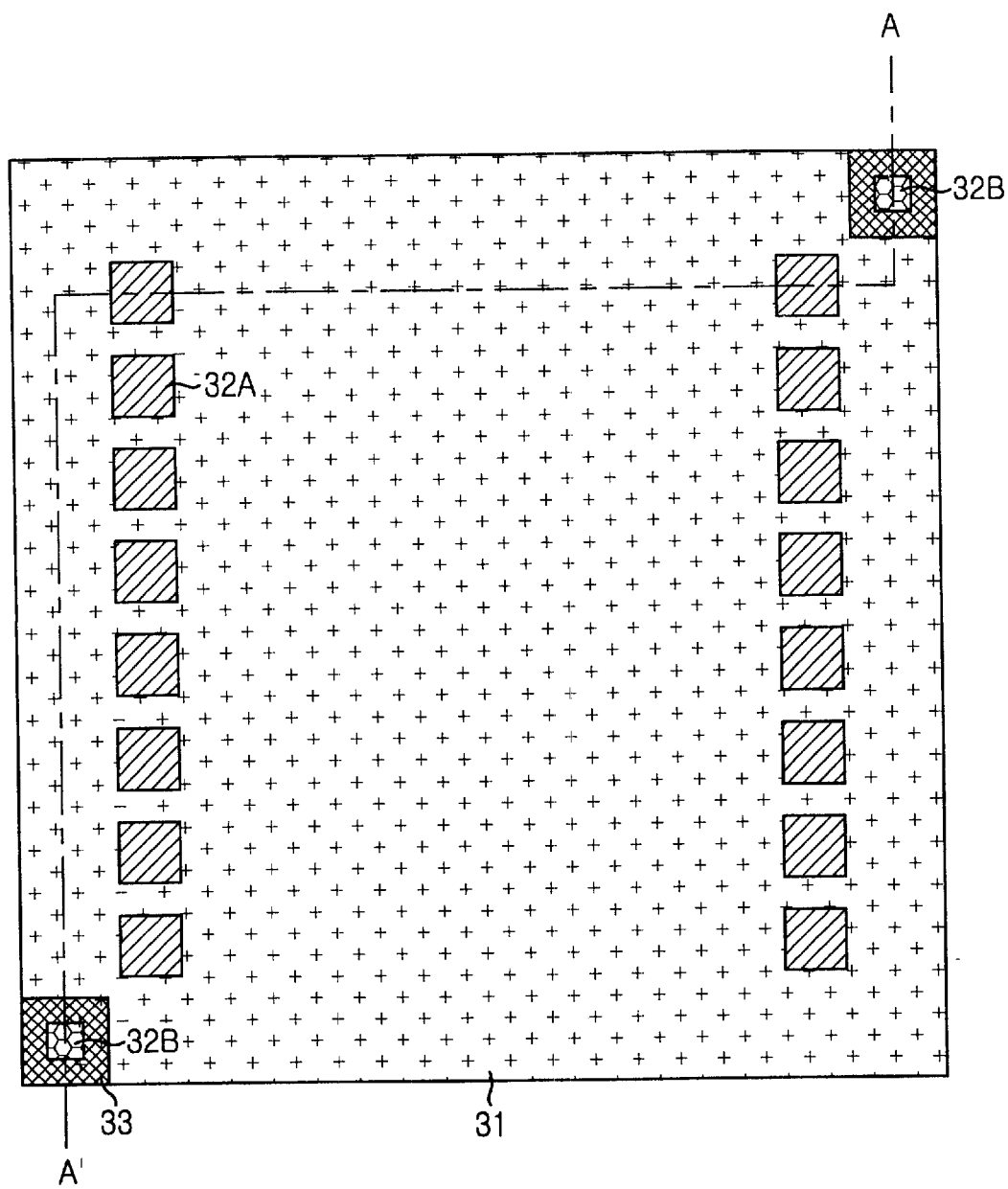
FIG. 3A is a diagram showing an array of bonding pads and alignment keys of an upper side of a memory device shown in FIG. 2B according to the present invention.

FIG. 3A is a diagram showing an array of the bonding pads 32A, the alignment keys 32B, the misalignment detecting layers 33 and a final metal wire (not shown) which are formed on the interlayer insulating layer 31. FIG. 2B is a cross-sectional view taken along the broken line A–A' of FIG. 3A. The bonding pads 32A have a size of 50 $\mu$m to 90 $\mu$m and are located on the inside of the alignment keys 32B. The alignment keys 32B have a size of 5 $\mu$m to 10 $\mu$m and are located on the outside of the bonding pads 32A. The misalignment detecting layers 33 have a size of 10 $\mu$m to 50 $\mu$m and surround the alignment keys 32B. Because the formation of the alignment keys 32B is simultaneously implemented in patterning the final metal wire, additional processing and cost are not needed.

Figure 2C:
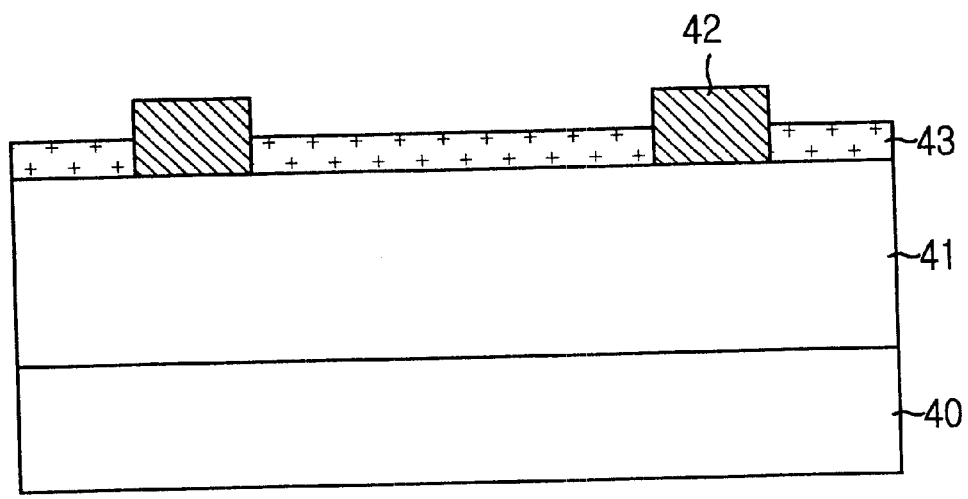
FIGS. 2C to 2D are cross-sectional views showing fabrication processes of a second semiconductor substrate of a merged memory and logic device according to the present invention.
Figure 2D:
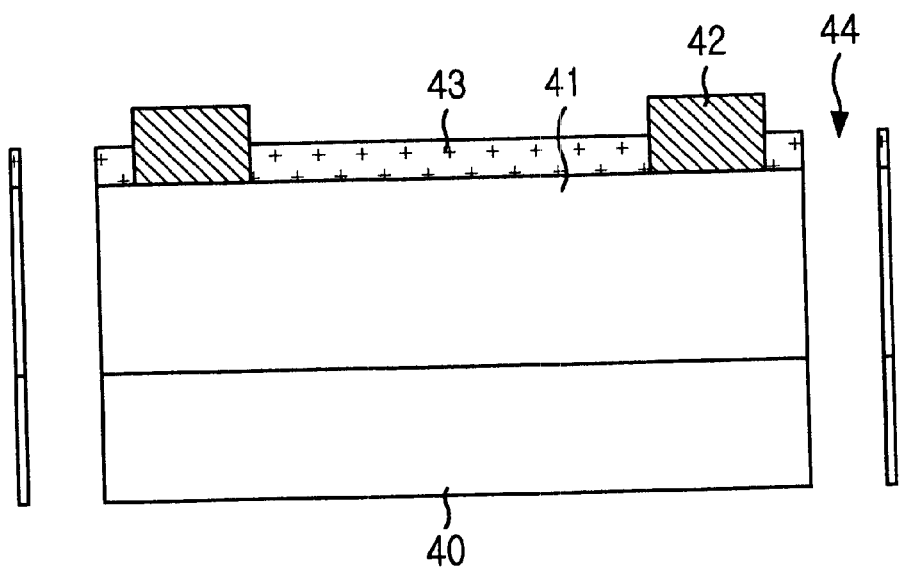

FIGS. 2C to 2D are cross-sectional views showing fabrication processes of a second semiconductor of a merged memory and logic device according to the present invention. As shown in FIG. 2C, an interlayer insulating layer 41 is formed in the second semiconductor substrate 40 on which a logic device (not shown) is provided and a final metal wire (not shown), such as an aluminum layer, is formed. Bonding pads 42 are formed in order to join the first and second semiconductor substrates 30 and 40. A protection layer 43 is formed on the bonding pad 42 and then the protection layer 43 is selectively etched back by a mask patterning process so as to expose an upper portion of the bonding pads 42. The interlayer insulating layer 41 is formed on logic transistors made of multi polysilicon layers and multiple metal wires. Contact holes for electrically connecting source/drain regions of the logic transistors and via holes for connecting metal wiring are formed therein.

In order to connect a memory device and a logic device separately formed on each of the first semiconductor substrate 30 and the second semiconductor substrate 40, circular alignment apertures 44 having a diameter of about 5 $\mu$m to 10 $\mu$m, and corresponding to the positions of alignment keys 32B formed on the first semiconductor substrate 30, are formed by the selective etching process using a laser beam.

Figure 3B:
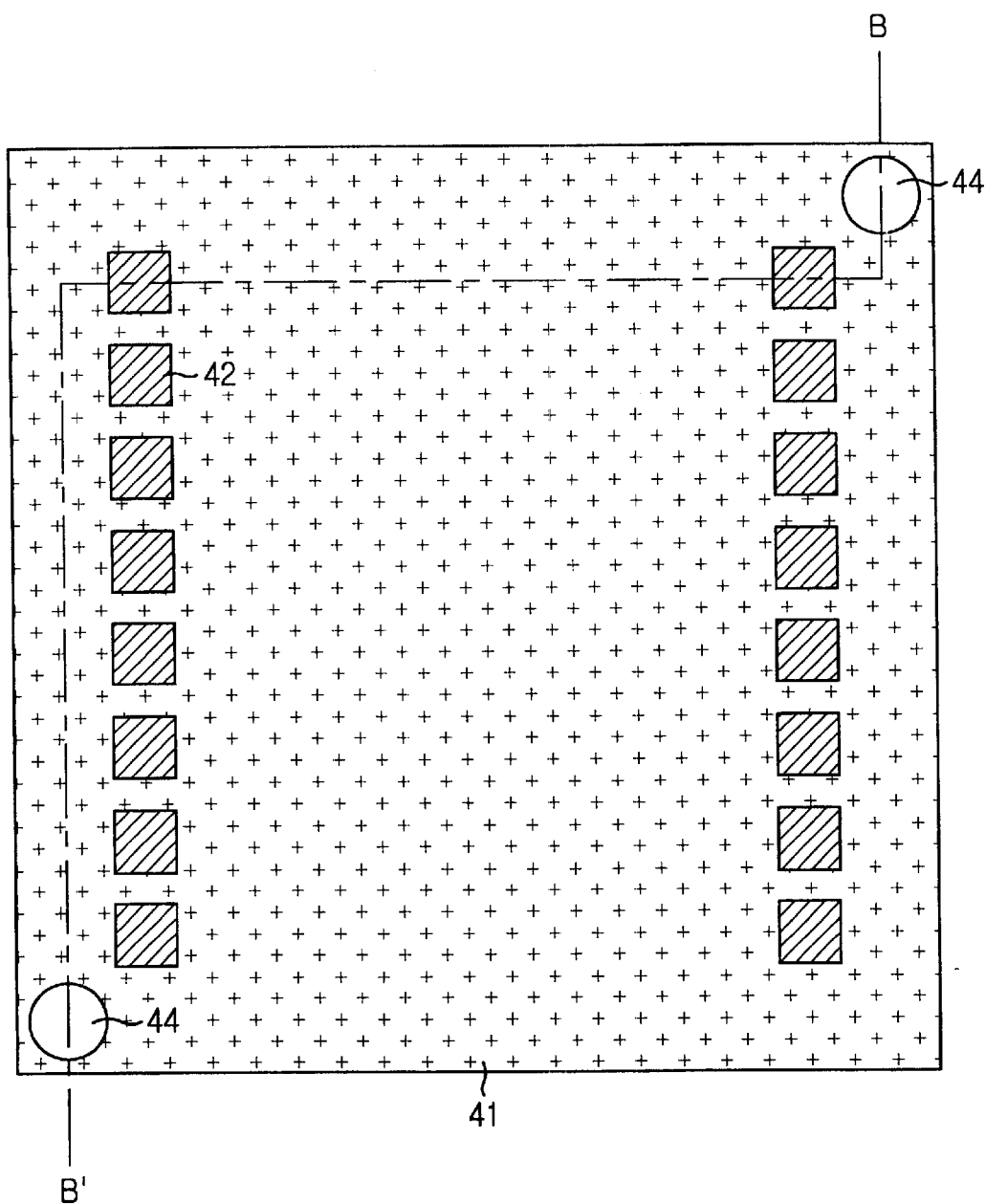
FIG. 3B is a diagram showing an array of bonding pads and alignment holes of an upper side of a logic device according to the present invention.

FIG. 3B is a diagram showing an array of the final metal wiring (not shown), bonding pads 42 and alignment apertures 44 in the logic device formed on the second semiconductor substrate 40 according to the present invention. FIG. 2D corresponds to a cross-sectional view taken along the broken line B–B' of FIG. 3B.

Figure 2E:
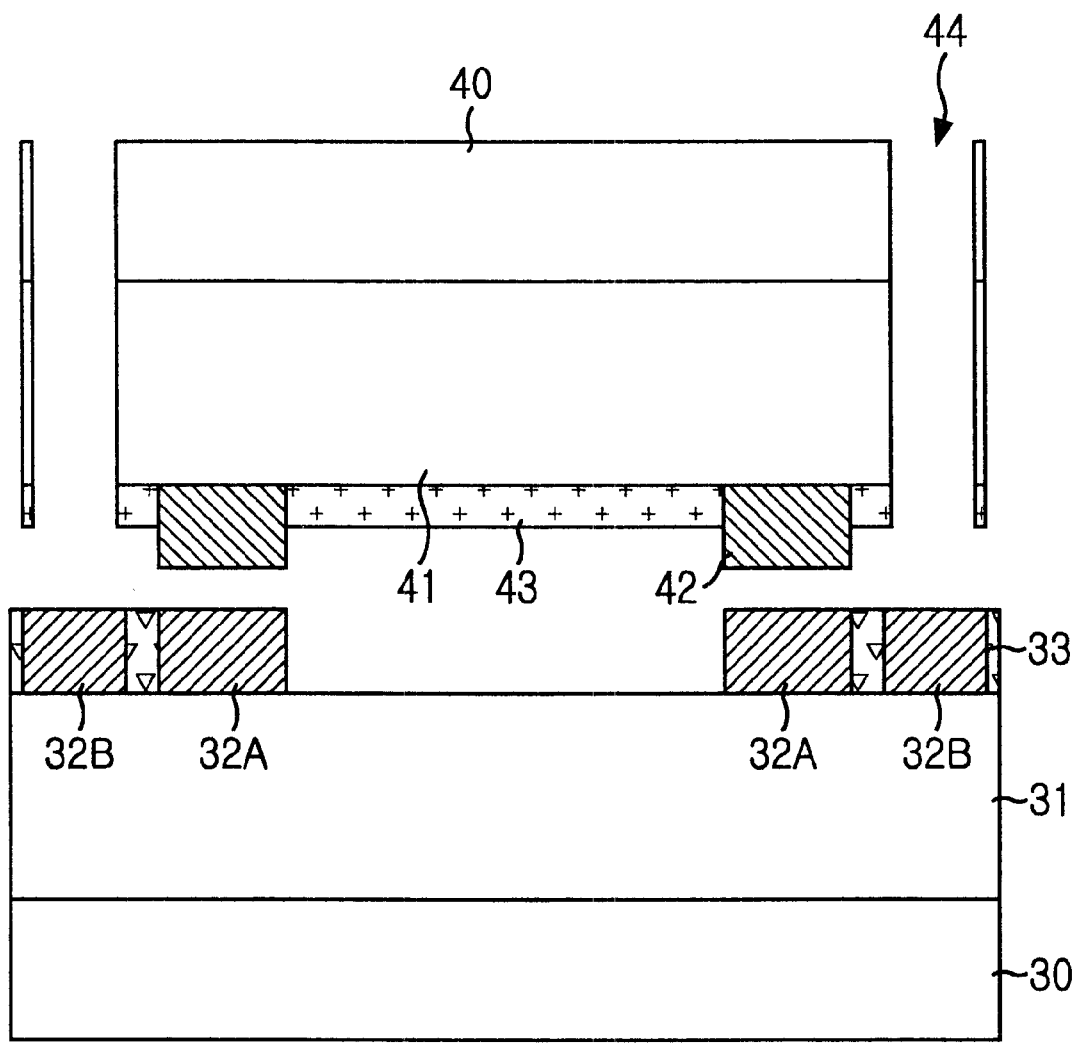
FIGS. 2E to 2G are cross-sectional views showing fabrication processes of joining the first semiconductor substrate and the second semiconductor substrate of a merged memory and logic device according to the present invention.

As shown in FIG. 2E, in order to join the bonding pads 42 over the second semiconductor substrate 40 to the bonding pads 32A over the first semiconductor substrate 30, the second semiconductor substrate 40 is turned upside down and then the first semiconductor substrate 30 and the second semiconductor substrate 40 are aligned. Because an accurate alignment between the bonding pads 32A over the first semiconductor substrate 30 and the bonding pads 42 over the second semiconductor substrate 40 is not expected, post processing is performed as follows.

Figure 2F:
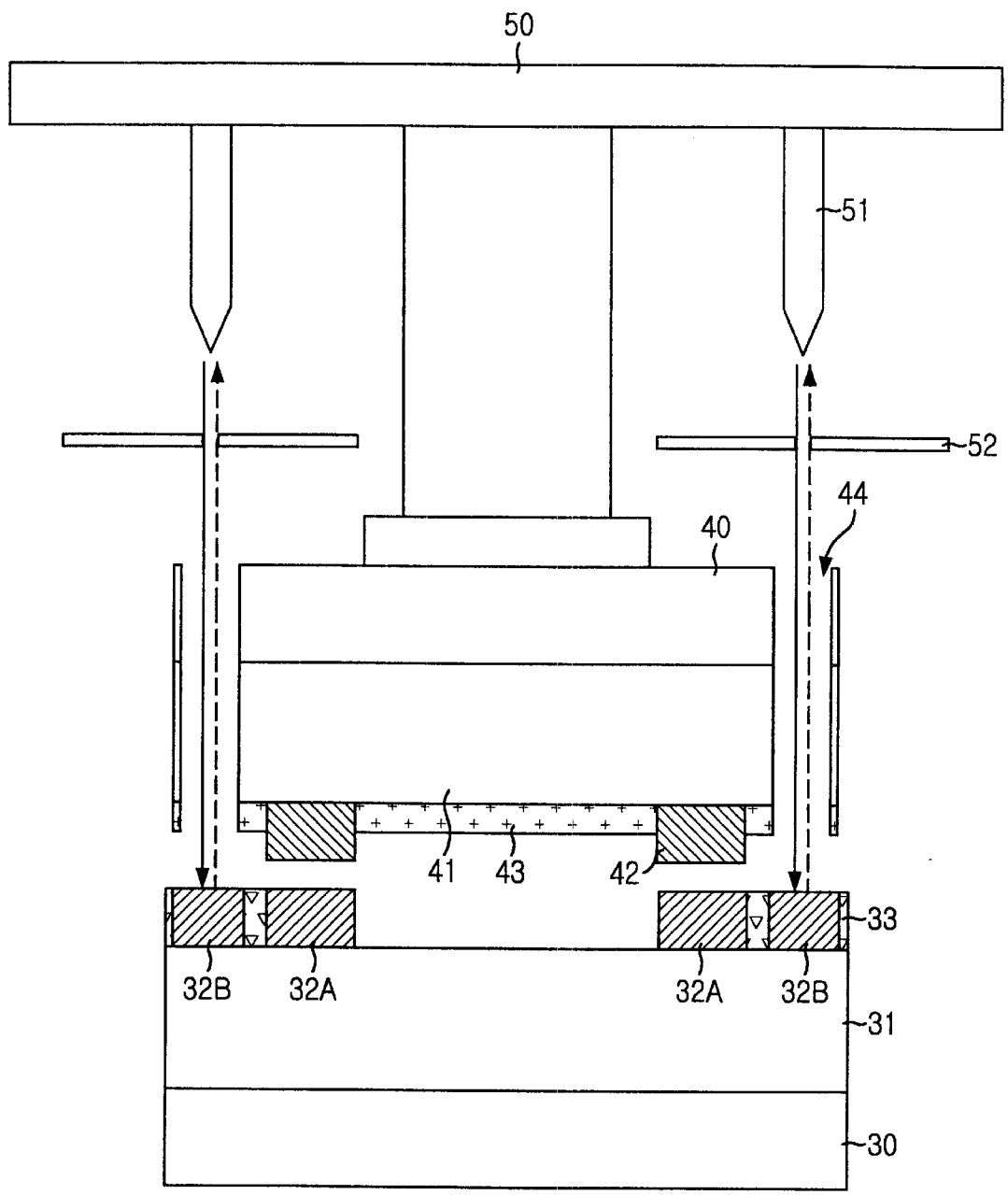
Figure 2G:
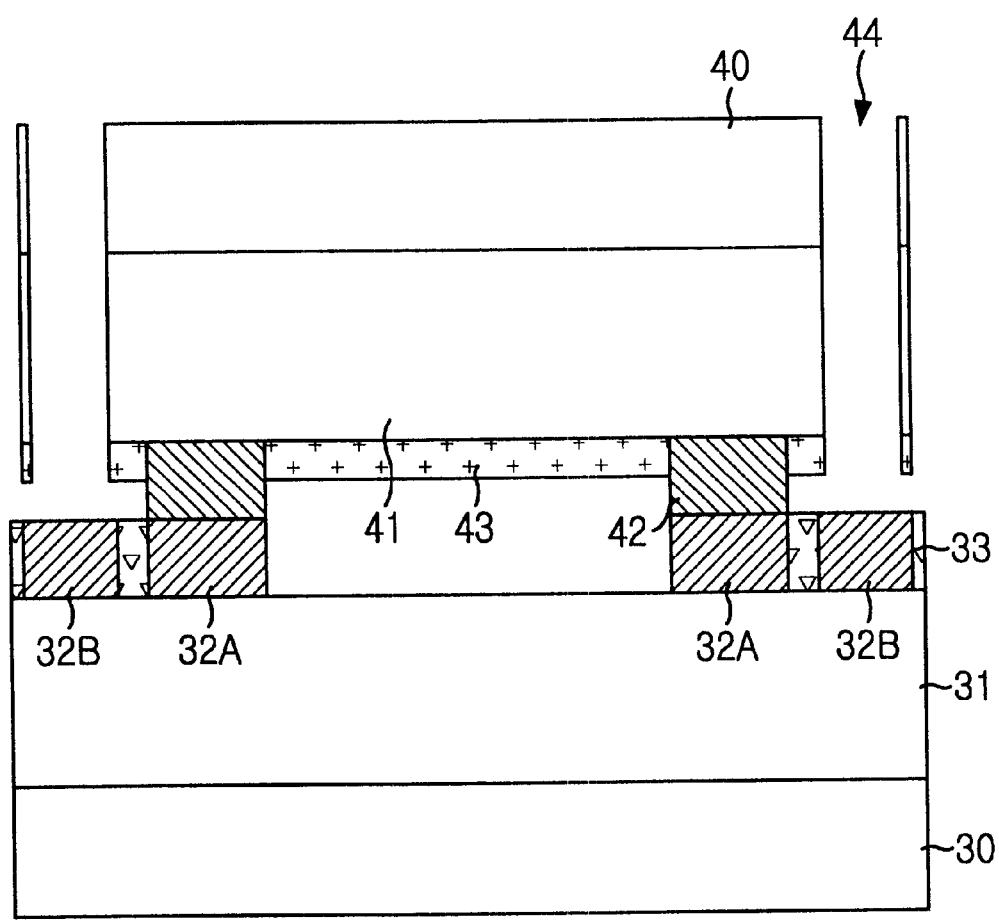

As shown in FIG. 2F, a bottom side of the second semiconductor substrate 40 is fixed with a vacuum pump in an aligner 50. An ultra violet (UV) beam having a wavelength of 350 nm to 450 nm is irradiated onto the top side of the first semiconductor substrate 30 through the alignment aperture 44 formed on the second semiconductor substrate 40 by using a UV beam projector, and a UV beam detector 52 detects the UV beam reflected from the alignment key 32B of the first semiconductor substrate 30.

If the alignment of the first semiconductor substrate 30 and the second semiconductor substrate 40 has been accurately performed, then 100% of the UV beam will be reflected from the alignment key 32B made of a metal layer. The reflected UV beam is detected in the UV beam detector and then the alignment processing between the substrates is completed.

If the first semiconductor substrate 30 and the second semiconductor substrate 40 are misaligned, however, the UV beam is irradiated to the misalignment detecting layer 33 around the alignment key 32B so that at least part of the UV beam is absorbed in the misalignment detecting layer 33 instead of being reflected. Accordingly, 100% of the UV beam is not detected at the UV beam detector 52 in the case of misalignment. A best alignment condition is searched for by changing the location of the second semiconductor substrate 40 attached by the vacuum pump in the mask aligner 50 on a step-by-step basis until the first semiconductor substrate 30 and the second semiconductor substrate 40 are aligned.

After an accurate alignment of the first semiconductor substrate 30 and the second semiconductor substrate 40 is performed, a thermal treatment is performed at a temperature of 350° C. to 450° C. As the bonding pads 32A of the first semiconductor substrate 30 and the bonding pads 42 of the second semiconductor substrate 40 are joined, each final metal wire (not shown) of the first and the second semiconductor substrate 30 and 40 is electrically connected.

Accordingly, the present invention can be adapted for all processes for accurately stacking two different semiconductor substrates in not only fabrication process of a merged memory and logic device including DRAM, SRAM or flash memory device, but also when fabricating a highly integrated memory device using a semiconductor stacking technique. Also, the present invention can be carried out without additional processing and cost for accurately stacking two different semiconductor substrates, and solves the problem of decreased throughput generated by pattern misalignment.

It will be apparent to those skilled in the art that various modification and variations can be made in the present invention without deviating from the spirit or scope of the invention. Thus, it is intended that the present invention cover the modification and variations of this invention provided they come within the scope of the appended claims and their equivalents.

What is claimed is:

1. A semiconductor device, comprising:

a first structure, including a first semiconductor substrate, at least one first bonding pad, and at least one alignment key formed on the first semiconductor substrate; and a second structure, including a second semiconductor substrate, at least one second bonding pad, and at least one alignment aperture passing through the second semiconductor substrate.

2. The semiconductor device as recited in claim 1, wherein the first structure further includes a misalignment key detecting layer formed on the first semiconductor substrate surrounding sidewalls of the alignment key, wherein the misalignment key detecting layer has a different reflectivity than the alignment key.

3. The semiconductor device as recited in claim 2, wherein the alignment key is a metal layer and the misalignment detecting layer is an insulating layer.

4. A semiconductor device, comprising:

a first structure, including a first semiconductor substrate having a first circuit device, a first interlayer insulating layer formed on the first semiconductor substrate, at least one first bonding pad formed on the first interlayer insulating layer, and at least one alignment key formed on the first interlayer insulating layer; and a second structure, including a second semiconductor substrate having a second circuit device, a second interlayer insulating layer formed on the second semiconductor substrate, at least one second bonding pad formed on the second interlayer insulating layer, and at least one beam guiding aperture passing through the second structure and providing a beam path to the alignment key on the first interlayer insulating layer.

5. The semiconductor device as recited in claim 4, wherein the first structure includes a misalignment detecting layer formed on the first interlayer insulating layer surrounding sidewalls of the alignment key, wherein the misalignment detecting layer has a different reflectivity than the alignment key.

6. The semiconductor device as recited in claim 5, wherein the alignment key is a metal layer and the misalignment detecting layer is an insulating layer.

7. The semiconductor device as recited in claim 6, wherein the first circuit device is a memory device and the second circuit device is a logic device.

* * * * *